United States Patent [19]
Bhan et al.

[11] Patent Number: 5,827,785
[45] Date of Patent: Oct. 27, 1998

[54] METHOD FOR IMPROVING FILM STABILITY OF FLUOROSILICATE GLASS FILMS

[75] Inventors: Mohan Krishan Bhan, Cupertino; Sudhakar Subrahmanyam, Sunnyvale; Anand Gupta, San Jose; Virendra V. S. Rana, Los Gatos, all of Calif.

[73] Assignee: Applied Materials, Inc., Santa Clara, Calif.

[21] Appl. No.: 736,555

[22] Filed: Oct. 24, 1996

[51] Int. Cl.[6] .................................................. H01L 21/316
[52] U.S. Cl. .......................... 438/784; 438/789; 427/579
[58] Field of Search ........................... 437/240; 438/783, 438/784, 789; 427/579

[56] References Cited

U.S. PATENT DOCUMENTS

| | | | |
|---|---|---|---|
| 4,894,352 | 1/1990 | Lane et al. | 437/238 |
| 5,045,346 | 9/1991 | Tabasky et al. | 427/39 |
| 5,182,000 | 1/1993 | Antonelli et al. | 204/181.1 |
| 5,275,977 | 1/1994 | Otsubo et al. | 437/235 |
| 5,290,383 | 3/1994 | Koshimuzu | 156/345 |
| 5,413,967 | 5/1995 | Matsuda et al. | 437/235 |
| 5,429,995 | 7/1995 | Nishiyama et al. | 437/238 |
| 5,563,105 | 10/1996 | Dobuzinsky et al. | 438/789 |
| 5,571,571 | 11/1996 | Musaka | 427/579 |
| 5,571,576 | 11/1996 | Qian et al. | 427/579 |
| 5,643,640 | 7/1997 | Chakravarti et al. | 427/578 |

FOREIGN PATENT DOCUMENTS

| | | |
|---|---|---|
| 08115901 | 5/1996 | Japan . |
| 92/20833 | 11/1992 | WIPO . |

OTHER PUBLICATIONS

K. Musaka, "Single Step Gap Filling Technology for Sub-half Micron Metal Spacings on Plasma Enhanced TEOS/$O_2$ Chemical Vapor Deposition System," *Extended Abstracts of the 1993 International Conference on Solid State Devices and Materials*, pp. 510–512, (1993).

Matsuri, Tetsuo, et al "Dual Frequency Plasma CVD Fluorosilicate Glass Deposition for 0.25 μm Interlevel Dielectrics", Feb. 1995, Dumic Conf., 1995, ISMIC–101D/95/0022, pp. 22–28, Feb. 1995.

Laxman, Ravi "Lone Dielectrics: CVD Fluorinated Silicon Dioxides" Semiconductor International, May 1995; pp. 71, 72, 74.

Lee, Hone, *Fundamentals of Microelectronics Processing*, McGraw–Hill, 1990, p. 395.

Wolf, Stanley, *Silicon Processing for the VLSI Era*, vol. 1, Lattice Press (1986) p. 162.

*Primary Examiner*—Charles L. Bowers, Jr.
*Assistant Examiner*—Matthew Whipple
*Attorney, Agent, or Firm*—Townsend and Townsend and Crew LLP

[57] ABSTRACT

A method and apparatus for improving film stability of a halogen-doped silicon oxide layer. The method includes the step of introducing a process gas including a first halogen source and a second halogen source, different from the first halogen source, into a deposition chamber along with silicon and oxygen sources. A plasma is then formed from the process gas to deposit a halogen-doped layer over a substrate disposed in the chamber. It is believed that the introduction of the additional halogen source enhances the etching effect of the film. The enhanced etching component of the film deposition improves the film's gap-fill capabilities and helps stabilizes the film. In a preferred embodiment, the halogen-doped film is a fluorosilicate glass film, $SiF_4$ is employed as the first halogen source, TEOS is employed as a source of silicon and the second halogen source is either $F_2$ or $NF_3$.

29 Claims, 9 Drawing Sheets

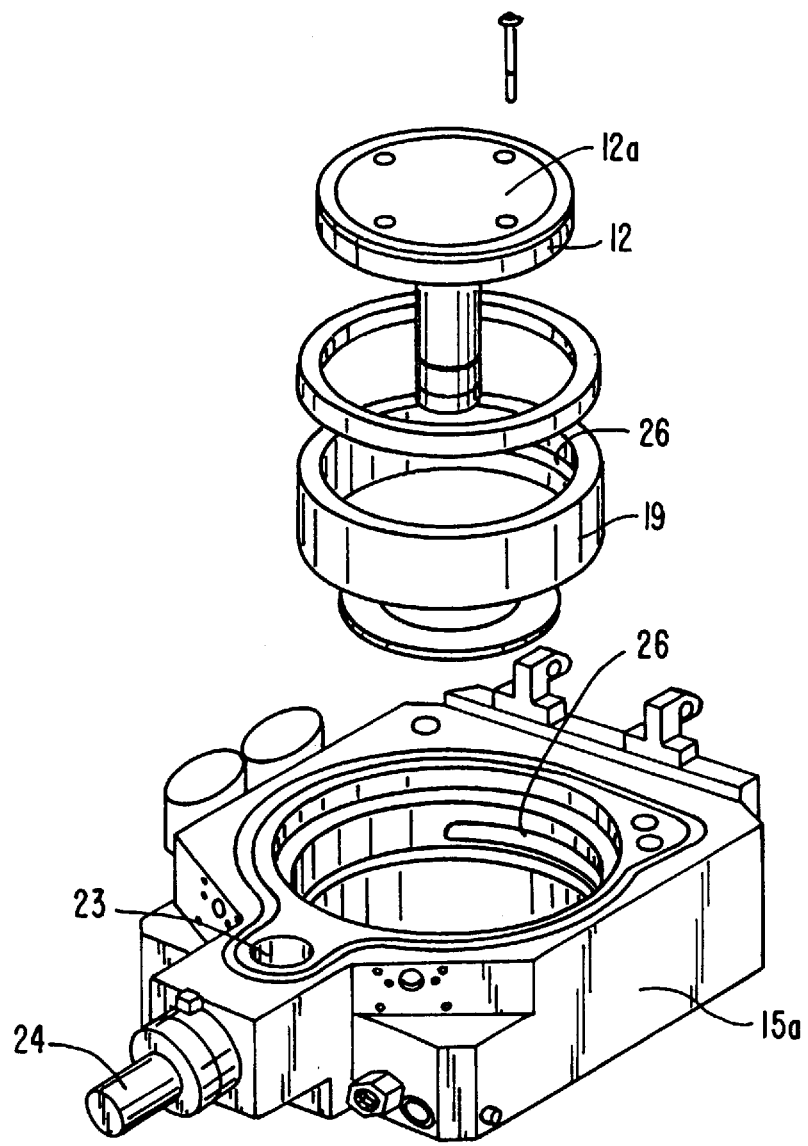
FIG. IC.

METHOD FOR IMPROVING FILM STABILITY OF FLUOROSILICATE GLASS FILMS

CROSS-REFERENCE TO RELATED APPLICATIONS

This application is related to U.S. Ser. No. 08/538,696, filed Oct. 2, 1995, entitled "USE OF $SIF_4$ TO DEPOSIT F-DOPED FILMS OF GREATER STABILITY"; and to U.S. Ser. No. 08/616,707, filed Mar. 15, 1996, entitled "METHOD AND APPARATUS FOR IMPROVING FILM STABILITY OF HALOGEN-DOPED SILICON OXIDE FILMS". The 08/538,696 and 08/616,707 applications are assigned to Applied Materials Inc, the assignee of the present invention, and are hereby incorporated by reference.

BACKGROUND OF THE INVENTION

The present invention relates to the deposition of halogen-doped dielectric layers during wafer processing, and more specifically to a method and apparatus for forming a fluorine-doped silicon oxide layer having a low dielectric constant, high film stability and good gap-fill properties.

One of the primary steps in the fabrication of modern semiconductor devices is the formation of a thin film on a semiconductor substrate by chemical reaction of gases. Such a deposition process is referred to as chemical vapor deposition or "CVD." Conventional thermal CVD processes supply reactive gases to the substrate surface where heat-induced chemical reactions produce a desired film. The high temperatures at which some thermal CVD processes operate can damage device structures having metal layers.

Another CVD method of depositing layers over metal layers at relatively low temperatures includes plasma enhanced CVD (PECVD) techniques. Plasma CVD techniques promote excitation and/or dissociation of the reactant gases by the application of radio frequency (RF) energy to a reaction zone near the substrate surface, thereby creating a plasma. The high reactivity of the species in the plasma reduces the energy required for a chemical reaction to take place, and thus lowers the required temperature for such CVD processes. The relatively low temperature of a PECVD process makes such processes ideal for the formation of insulating layers over deposited metal layers and for the formation of other insulating layers.

Semiconductor device geometries have dramatically decreased in size since such devices were first introduced several decades ago. Since then, integrated circuits have generally followed the two year/half-size rule (often called "Moore's Law"), which means that the number of devices that will fit on a chip doubles every two years. Today's wafer fabrication plants are routinely producing integrated circuits having 0.5–$\mu$m and even 0.35–$\mu$m features, and tomorrow's plants soon will be producing devices having even smaller geometries.

As devices become smaller and integration density increases, issues that were not previously considered important by the industry are becoming of concern. With the advent of multilevel metal technology in which three, four, or more layers of metal are formed on the semiconductors, one goal of semiconductor manufacturers is lowering the dielectric constant of insulating layers such as intermetal dielectric (IMD) layers. Low dielectric constant films are particularly desirable for IMD layers to reduce the RC time delay of the interconnect metallization, to prevent cross-talk between the different levels of metallization, and to reduce device power consumption.

Many approaches to obtain lower dielectric constants have been proposed. One of the more promising solutions is the incorporation of fluorine or other halogen elements, such as chlorine or bromine, into a silicon oxide layer. It is believed that fluorine, the preferred halogen dopant for silicon oxide films, lowers the dielectric constant of the silicon oxide film because fluorine is an electronegative atom that decreases the polarizability of the overall SiOF network. Fluorine-doped silicon oxide films are also referred to as fluorosilicate glass (FSG) films.

One particular method of depositing an FSG film forms a plasma from a process gas that includes $SiF_4$, tetraethoxysilane (TEOS) and $O_2$ precursors. It is believed that $SiF_4$ is a particularly effective fluorine source for FSG films because the four fluorine atoms bonded to a silicon atom in a molecule of the gas supply a higher percentage of fluorine into the deposition chamber for a given flow rate as compared with other fluorine sources. Additionally, $SiF_4$ has more fluorine bonded to silicon available for the plasma reaction than other fluorine sources. The use of $SiF_4$ as a source of fluorine for FSG films is discussed in more detail in U.S. Ser. Nos. 08/538,696 and 08/616,707 previously mentioned.

In addition to decreasing the dielectric constant, incorporating fluorine in intermetal silicon oxide layers also helps solve common problems encountered in fabricating smaller geometry devices, such as filling closely spaced gaps on semiconductor structures. Because fluorine is an etching species, it is believed that fluorine doping introduces an etching effect on the growing film. This simultaneous deposition/etching effect allows FSG films to have improved gap filling capabilities such that the films are able to adequately cover adjacent metal layers having an aspect ratio of 1.8 or more.

Thus, manufacturers desire to include fluorine in various dielectric layers and particularly in intermetal dielectric layers. One problem encountered in the deposition of FSG layers is film stability. Loosely bound fluorine atoms in the lattice structure of some FSG films result in the films having a tendency to absorb moisture. The absorbed moisture increases the film's dielectric constant and can cause further problems when the film is exposed to a thermal process such as an anneal process. The high temperature of the thermal processes can move the absorbed water molecules and loosely bound fluorine atoms out of the oxide layer through metal or other subsequently deposited layers. The excursion of molecules and atoms in this manner is referred to as outgassing. Such outgassing can be determined by detecting HF or $H_2O$ leaving the film as the film is heated to a specified temperature. It is desirable to have little or no outgassing at temperatures up to at least the maximum temperature used during substrate processing after the FSG film has been deposited (e.g., up to 450° C. in some instances).

Generally, the dielectric constant and gap-fill capabilities of an FSG film are related to the amount of fluorine incorporated into the film. Increasing the fluorine content decreases the dielectric constant and improves gap-fill. FSG films having a high fluorine content (e.g., above 7 or 8 atomic weight percent [at. wt. %] fluorine), however, are more likely to have moisture absorption and outgassing problems than films of a lower fluorine content (e.g., lower than 7 or 8 at. wt. % fluorine).

From the above, it can be seen that an oxide film having a low dielectric constant is necessary to keep pace with emerging technologies. It can also be seen that a method of increasing the stability of halogen-doped oxide films, and in particular, high fluorine content FSG films, thereby reducing moisture absorption and outgassing in the films, is desirable.

SUMMARY OF THE INVENTION

The present invention provides a halogen-doped layer having a low dielectric constant and improved stability even at high halogen-doped levels. The invention also provides a method and apparatus for forming such a layer. Film stability is improved by introducing a first halogen source gas and a second halogen source gas, different from the first halogen source, into a deposition chamber along with silicon and oxygen sources. A plasma is then formed from the gases to deposit a halogen-doped layer over a substrate disposed in the chamber. It is believed that the introduction of the additional halogen source provides extra free fluorine for the plasma and enhances the etching effect of the film. The enhanced etching component of the film deposition improves the film's gap-fill capabilities and helps stabilizes the film.

An FSG film is deposited according to a preferred embodiment of the method of the present invention. In this embodiment, the first halogen source gas is $SiF_4$ and the silicon source is TEOS. The oxygen source can be from $O_2$, $N_2$ or a similar gas and the second halogen source is either $NF_3$, $F_2$ or a similar source. The ratio of TEOS to oxygen is relatively high, being between about 1.9:1 to 5.8:1, and the ratio of the second halogen source to the first is between about 0.0125:1 to 0.5:1. An FSG film deposited according to this embodiment can incorporate up to at least 9–10 at. wt. % fluorine and show substantially no $H_2O$ or HF outgasses from the layer when heated to a temperature up to at least 450° C.

These and other embodiments of the present invention, as well as its advantages and features, are described in more detail in conjunction with the text below and the attached figures.

BRIEF DESCRIPTION OF THE DRAWINGS

FIGS. 1C and 1D are exploded perspective view of parts of the CVD chamber depicted in FIG. 1A;

DETAILED DESCRIPTION OF THE PREFERRED EMBODIMENTS

I. Introduction

The present invention allows deposition of an insulating layer having a low dielectric constant (in some embodiments, less than about 3.5) and desirable gap-fill properties. The insulating layer of the present invention is stable when exposed to temperatures up to at least 450° C. and can be deposited in CVD chambers of conventional design.

II. Exemplary CVD System

Figure 1A:
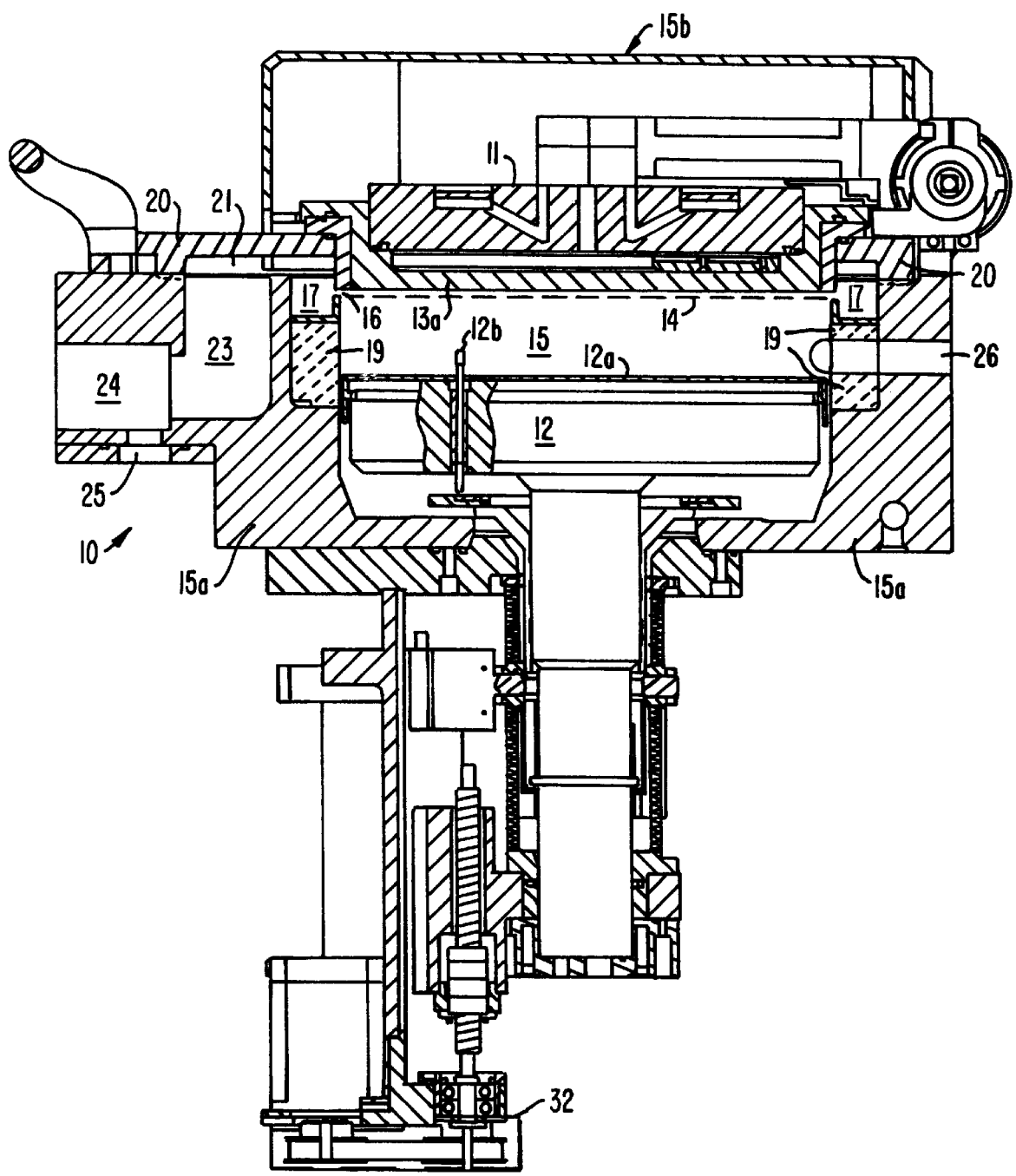
FIGS. 1A and 1B are vertical, cross-sectional view of one embodiment of a chemical vapor deposition apparatus according to the present invention.
Figure 1B:
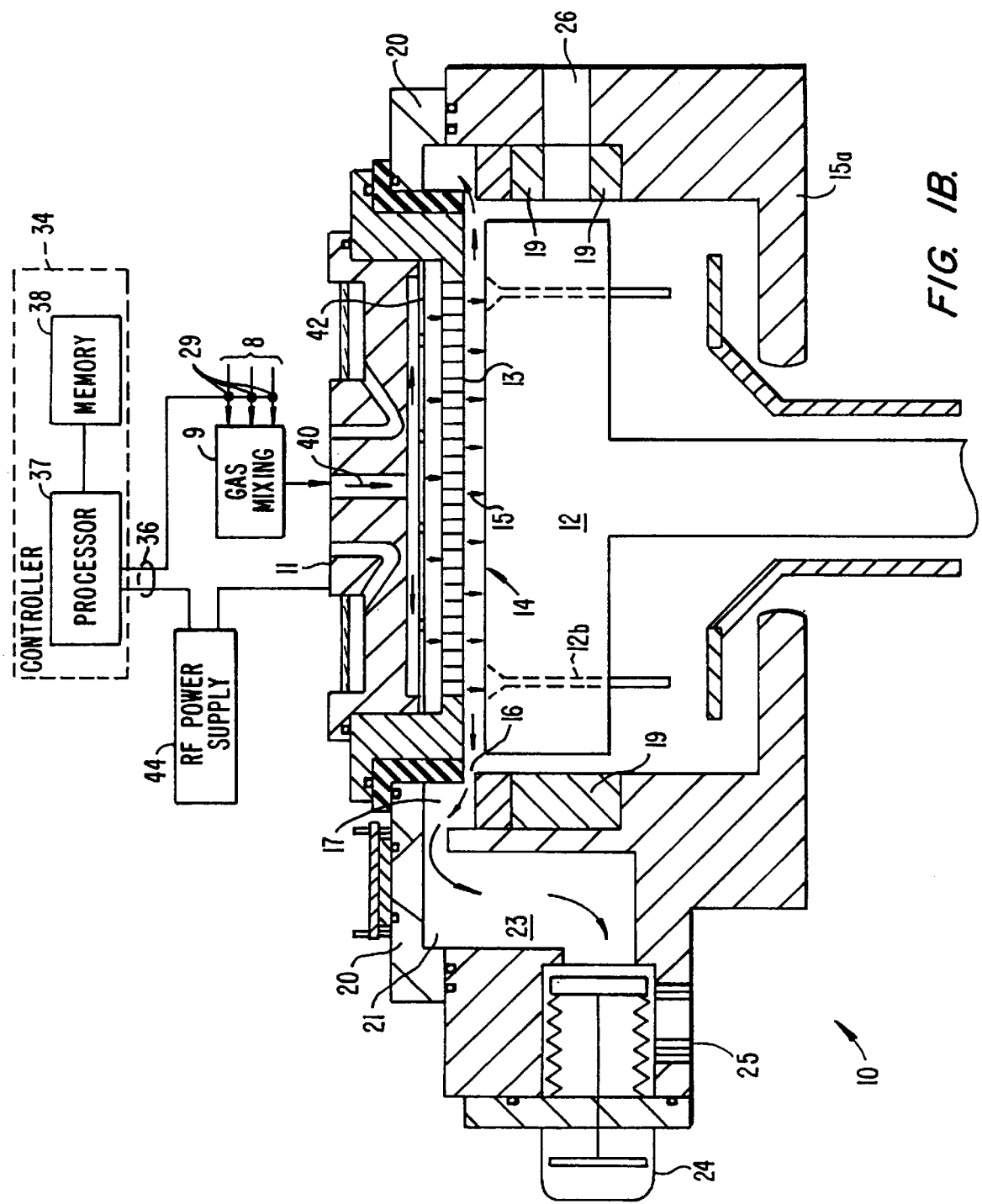
Figure 1D:
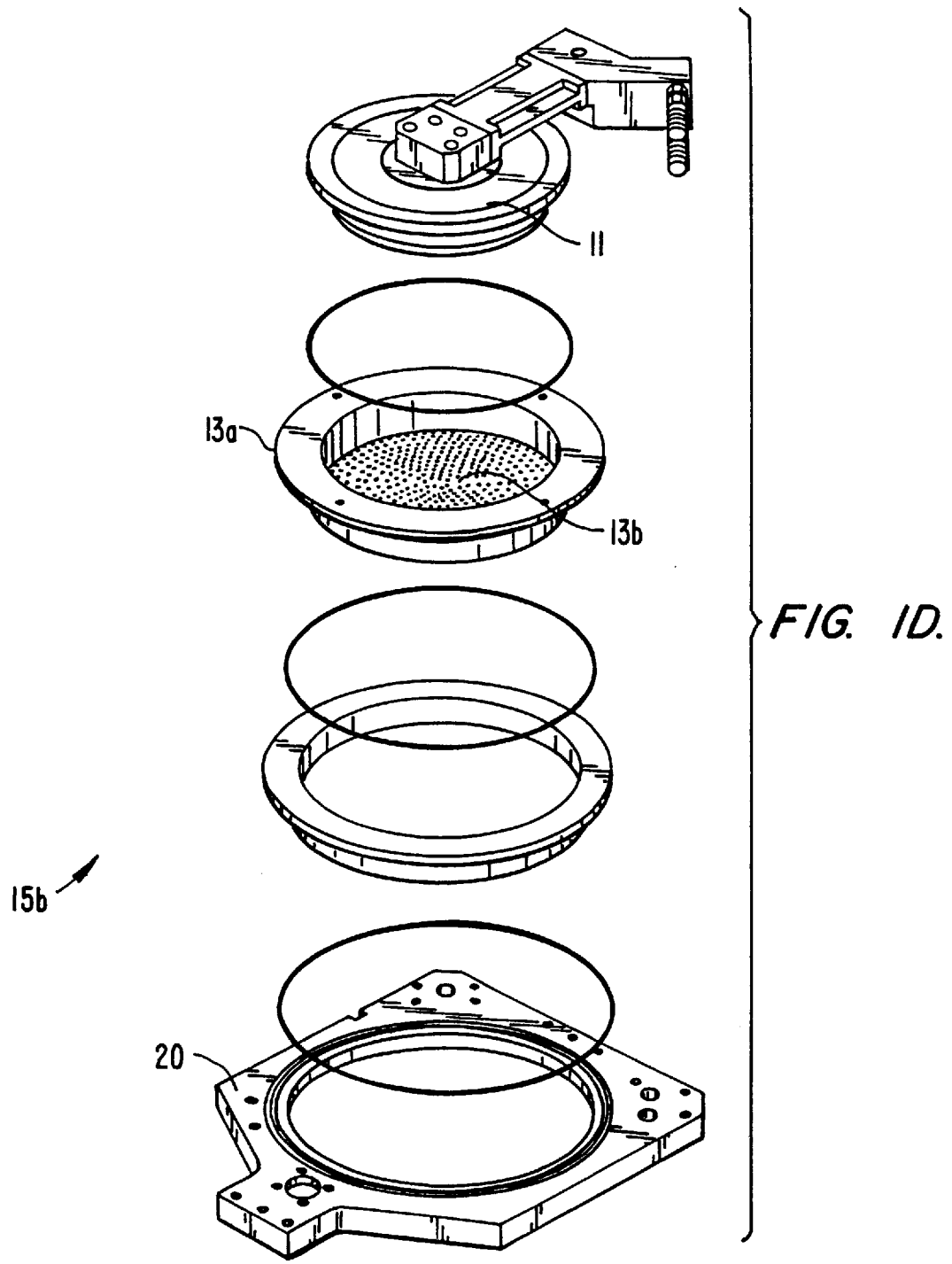

One suitable CVD machine in which the method of the present invention can be carried out is shown in FIGS. 1A and 1B, which are vertical, cross-sectional views of a chemical vapor deposition system 10, having a vacuum or processing chamber 15 that includes a chamber wall 15a and chamber lid assembly 15b. Chamber wall 15a and chamber lid assembly 15b are shown in exploded, perspective views in FIGS. 1C and 1D.

Reactor 10 contains a gas distribution manifold 11 for dispersing process gases to a substrate (not shown) that rests on a heated pedestal 12 centered within the process chamber. During processing, the substrate (e.g. a semiconductor wafer) is positioned on a flat (or slightly convex) surface 12a of pedestal 12. The pedestal can be controllably moved between a lower loading/off-loading position (depicted in FIG. 1A) and an upper processing position (indicated by dashed line 14 in FIG. 1A and shown in FIG. 1B) which is closely adjacent to manifold 11. A centerboard (not shown) includes sensors for providing information on the position of the wafers.

Deposition and carrier gases are introduced into chamber 15 through perforated holes 13b (FIG. 1D) of a conventional flat, circular gas distribution face plate 13a. More specifically, deposition process gases flow into the chamber through the inlet manifold 11 (indicated by arrow 40 in FIG. 1B), through a conventional perforated blocker plate 42 and then through holes 13b in gas distribution faceplate 13a.

Before reaching the manifold, deposition and carrier gases are input through gas supply lines 8 into a mixing system 9 where they are combined and then sent to manifold 11. Generally, the supply line for each process gas includes (i) several safety shut-off valves (not shown) that can be used to automatically or manually shut off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in reactor 10 can be either a thermal process or a plasma enhanced process. In a plasma enhanced process, an RF power supply 44 applies electrical power between the gas distribution faceplate 13a and the pedestal so as to excite the process gas mixture to form a plasma within the cylindrical region between the faceplate 13a and the pedestal. (This region will be referred to herein as the "reaction region"). Constituents of the plasma react to deposit a desired film on the surface of the semiconductor wafer supported on pedestal 12. RF power supply 44 is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 15.

During a deposition process, the plasma heats the entire process chamber 10, including the walls of the chamber body 15a surrounding the exhaust passageway 23 and the shutoff valve 24. When the plasma is not turned on, a hot liquid is circulated through the walls 15a of the process chamber to maintain the chamber at an elevated temperature. Fluids used to heat the chamber walls 15a include the typical fluid types, i.e., water based ethylene glycol or oil based thermal transfer fluids. This heating beneficially reduces or eliminates condensation of undesirable reactant products and improves the elimination of volatile products of the process gases and other contaminants which might contaminate the process if they were to condense on the walls of cool vacuum passages and migrate back into the processing chamber during periods of no gas flow.

The remainder of the gas mixture that is not deposited in a layer, including reaction products, is evacuated from the chamber by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360° circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut off valve 24 (whose body is integrated with the lower chamber wall 15a), and into the exhaust outlet 25 which connects to the external vacuum pump (not shown) through a foreline (also not shown).

The wafer support platter of the pedestal 12 (preferably aluminum) is heated using a double full turn single loop embedded heater element configured to form parallel concentric circles. An outer portion of the heater element runs adjacent to a perimeter of the support platter while an inner portion runs on the path of a concentric circle having a smaller radius. The wiring to the heater element passes through the stem of the pedestal 12.

Typically, any or all of the chamber lining, gas inlet manifold faceplate, and various other reactor hardware is made out of material such as aluminum or anodized aluminum. An example of such a CVD apparatus is described in a U.S. Pat. 5,558,717 entitled "CVD Processing Chamber," issued to Zhao et al. The 5,558,717 patent is assigned to Applied Materials, Inc., the assignee of the present invention, and is hereby incorporated by reference in its entirety.

A lift mechanism and motor 32 raises and lowers the heater pedestal assembly 12 and its wafer lift pins 12b as wafers are transferred into and out of the body of the chamber by a robot blade (not shown) through an insertion/removal opening 26 in the side of the chamber 10. The motor 32 raises and lowers pedestal 12 between a processing position 14 and a lower, wafer-loading position. The motor, valves or flow controllers 29 connected to supply lines 8, gas delivery system, throttle valve 32, RF power supply 44, and chamber and substrate heating systems are all controlled by a system controller 34 over control lines 36 of which only some are shown. Controller 34 relies on feedback from optical sensors to determine the position of moveable mechanical assemblies such as the throttle valve and susceptor which are moved by appropriate motors under the control of controller 34.

In a preferred embodiment, the system controller includes a hard disk drive (memory 38), a floppy disk drive and a processor 37. The processor contains a single board computer (SBC), analog and digital input/output boards, interface boards and stepper motor controller boards. Various parts of CVD system 10 conform to the Versa Modular Europeans (VME) standard which defines board, card cage, and connector dimensions and types. The VME standard also defines the bus structure having a 16-bit data bus and 24-bit address bus.

System controller 34 controls all of the activities of the CVD machine. The system controller executes system control software, which is a computer program stored in a computer-readable medium such as a memory 38. Preferably, memory 38 is a hard disk drive, but memory 38 may also be other kinds of memory. The computer program includes sets of instructions that dictate the timing, mixture of gases, chamber pressure, chamber temperature, RF power levels, susceptor position, and other parameters of a particular process. Of course, other computer programs such as one stored on another memory device including, for example, a floppy disk or other another appropriate drive, may also be used to operate controller 34.

Figure 1E:
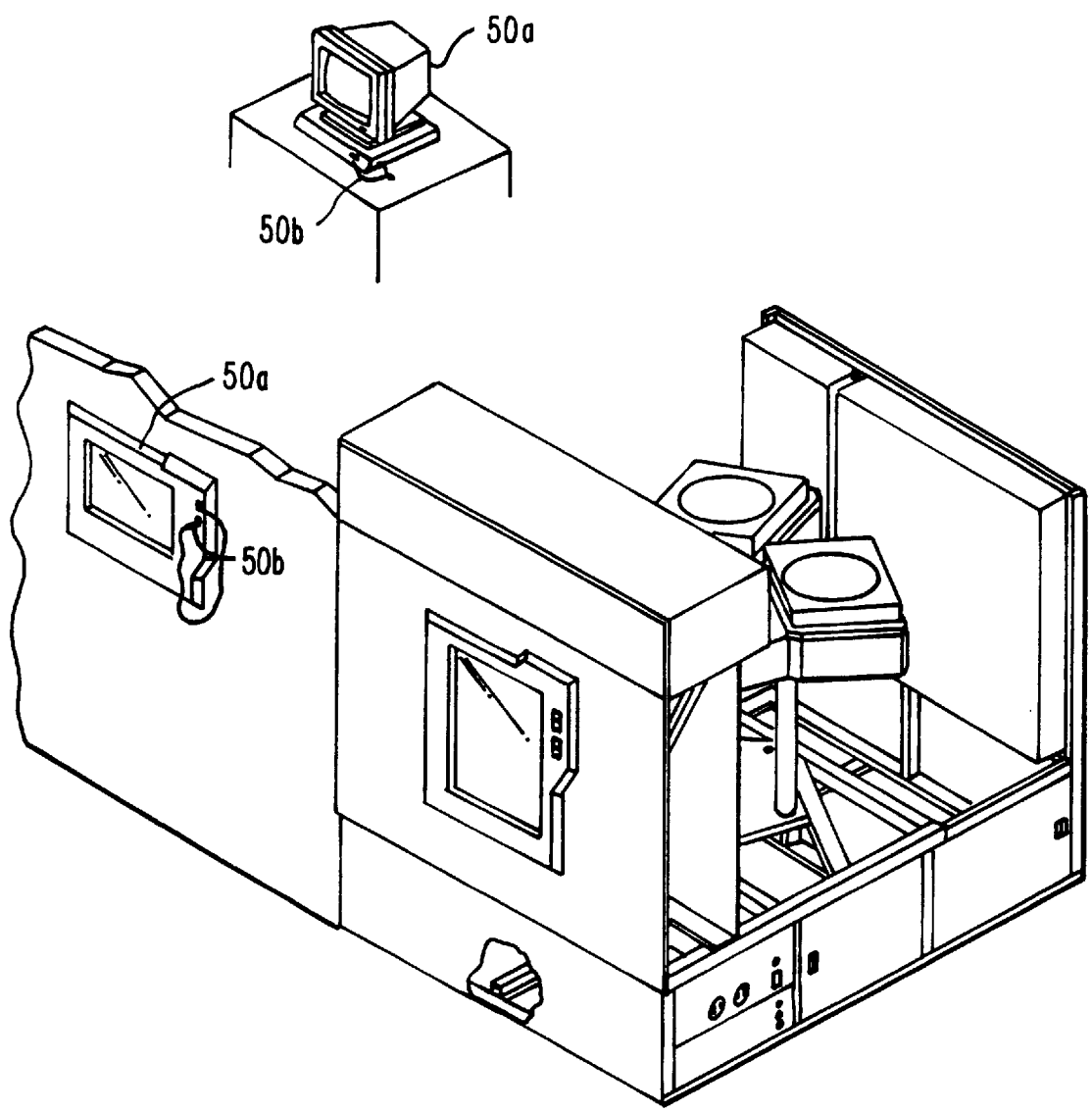
FIG. 1E is a simplified diagram of system monitor and CVD system 10 in a multi-chamber system, which may include one or more chambers.

The interface between a user and controller 34 is via a CRT monitor 50a and light pen 50b, shown in FIG. 1E, which is a simplified diagram of the system monitor and CVD system 10 in a multi-chamber system, which may include one or more chambers. In the preferred embodiment two monitors 50a are used, one mounted in the clean room wall for the operators and the other behind the wall for the service technicians. Both monitors 50a simultaneously display the same information, but only one light pen 50b is enabled. The light pen 50b detects light emitted by CRT display with a light sensor in the tip of the pen. To select a particular screen or function, the operator touches a designated area of the display screen and pushes the button on the pen 50b. The touched area changes its highlighted color, or a new menu or screen is displayed, confirming communication between the light pen and the display screen. Of course, other devices, such as a keyboard, mouse, or other pointing or communication device, may be used instead of or in addition to light pen 50b to allow the user to communicate with controller 34.

The process for depositing the film can be implemented using a computer program product that is executed by controller 34. The computer program code can be written in any conventional computer readable programming language, such as, 68000 assembly language, C, C++, Pascal, Fortran, or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

Figure 1F:
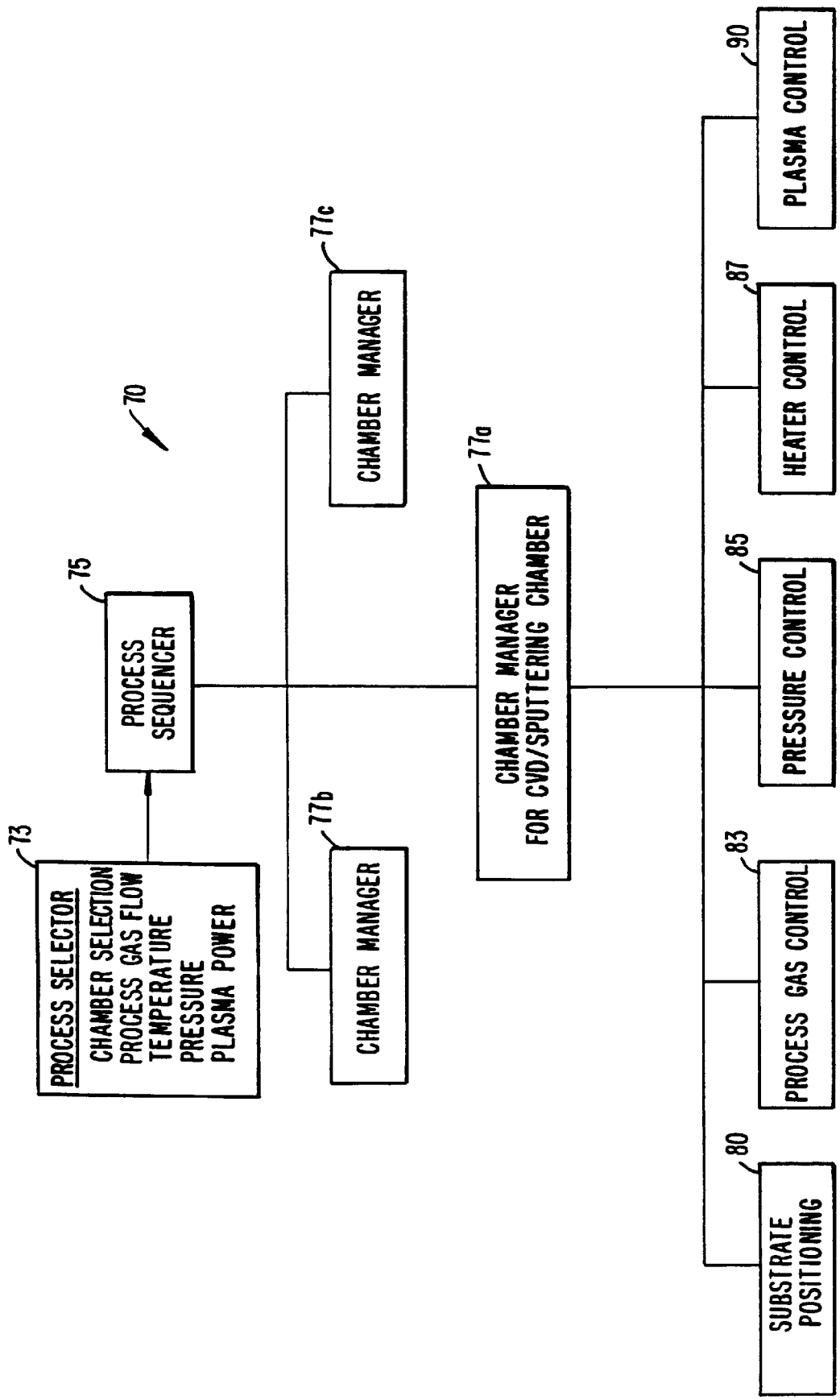
FIG. 1F shows an illustrative block diagram of the hierarchical control structure of the system control software, computer program 70, according to a specific embodiment.

FIG. 1F shows an illustrative block diagram of the hierarchical control structure of the system control software, computer program 70, according to a specific embodiment. A user enters a process set number and process chamber number into a process selector subroutine 73 in response to menus or screens displayed on the CRT monitor by using the light pen interface. The process sets are predetermined sets of process parameters necessary to carry out specified processes, and are identified by predefined set numbers. The process selector subroutine 73 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature and are provided to the user in the form of a recipe. The parameters specified by the process recipe are entered utilizing the light pen/CRT monitor interface.

The signals for monitoring the process are provided by the analog input and digital input boards of the system controller and the signals for controlling the process are output on the analog output and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 75 can be designed to take into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 causes execution of the process set by passing the particular process set parameters to a chamber manager subroutine 77a–c which controls multiple processing tasks in a process chamber 15 according to the process set determined by the sequencer subroutine 75. For example, the chamber manager subroutine 77a comprises program code for controlling sputtering and CVD process operations in the process chamber 15. The chamber manager subroutine 77 also controls execution of various chamber component subroutines which control operation of the chamber components necessary to carry out the selected process set. Examples of chamber component subroutines are substrate positioning subroutine 80, process gas control subroutine 83, pressure control subroutine 85, heater control subroutine 87, and plasma control subroutine 90. Those having ordinary skill in the art would readily recognize that other chamber control subroutines can be included depending on what processes are desired to be performed in the process chamber 15. In operation, the chamber manager subroutine 77a selectively schedules or calls the process component subroutines in accordance with the particular process set being executed. The chamber manager subroutine 77a schedules the process component subroutines similarly to how the sequencer subroutine 75 schedules which process chamber 15 and process set is to be executed next. Typically, the chamber manager subroutine 77a includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 1F. The substrate positioning subroutine 80 comprises program code for controlling chamber components that are used to load the substrate onto the pedestal 12, and optionally to lift the substrate to a desired height in the chamber 15 to control the spacing between the substrate and the gas distribution manifold 11. When a substrate is loaded into the process chamber 15, the pedestal 12 is lowered to receive the substrate, and thereafter, the pedestal 12 is raised to the desired height in the chamber, to maintain the substrate at a first distance or spacing from the gas distribution manifold during the CVD process. In operation, the substrate positioning subroutine 80 controls movement of the susceptor in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines, and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates, and activating the safety shut-off valves when an unsafe condition is detected.

In some processes, an inert gas such as helium or argon is flowed into the chamber 15 to stabilize the pressure in the chamber before reactive process gases are introduced into the chamber. For these processes, the process gas control subroutine 83 is programmed to include steps for flowing the inert gas into the chamber 15 for an amount of time necessary to stabilize the pressure in the chamber, and then the steps described above would be carried out. Additionally, when a process gas is to be vaporized from a liquid precursor, for example tetraethylorthosilane ("TEOS"), the process gas control subroutine 83 would be written to include steps for bubbling a delivery gas such as helium through the liquid precursor in a bubbler assembly or introducing a carrier gas such as helium to a liquid injection system. When a bubbler is used for this type of process, the process gas control subroutine 83 regulates the flow of the delivery gas, the pressure in the bubbler, and the bubbler temperature in order to obtain the desired process gas flow rates. As discussed above, the desired process gas flow rates are transferred to the process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 85 comprises program code for controlling the pressure in the chamber 15 by regulating the size of the opening of the throttle valve in the exhaust system (not shown) of the chamber. The size of the opening of the throttle valve is set to control the chamber pressure to the desired level in relation to the total process gas flow, size of the process chamber, and pumping setpoint pressure for the exhaust system 115. When the pressure control subroutine 85 is invoked, the desired, or target, pressure level is received as a parameter from the chamber manager subroutine 77a. The pressure control subroutine 85 operates to measure the pressure in the chamber 15 by reading one or more conventional pressure nanometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 85 can be written to open or close the throttle valve to a particular opening size to regulate the chamber 15 to the desired pressure.

The heater control subroutine 87 comprises program code for controlling the current to the heating unit that is in thermal communication with the pedestal 12, such as the aforementioned single loop embedded heater element control subroutine 87 is also invoked by the chamber manager subroutine 77a and receives a target, or setpoint, temperature parameter. The heater control subroutine 87 measures the temperature by measuring voltage output of a thermocouple located in the pedestal 12, compares the measured temperature to the setpoint temperature, and increases or decreases current applied to the heating unit to obtain the setpoint temperature. The temperature is obtained from the measured voltage by looking up the corresponding temperature in a stored conversion table, or by calculating the temperature using a fourth order polynomial. When the embedded loop is used to heat the pedestal 12, the heater control subroutine 87 gradually controls a ramp up/down of current applied to the loop. The gradual ramp up/down increases the life and reliability of the lamp. Additionally, a built-in fail-safe mode can be included to detect process safety compliance, and can shut down operation of the heating unit if the process chamber 15 is not properly set up.

The plasma control subroutine 90 comprises program code for setting low and high frequency the RF power levels applied to the process electrodes in the chamber 15, and to set the low frequency RF frequency employed. Similar to the previously described chamber component subroutines, the plasma control subroutine 90 is invoked by the chamber manager subroutine 77a.

The above reactor description is mainly for illustrative purposes, and other plasma CVD equipment such as electron cyclotron resonance (ECR) plasma CVD devices, induction coupled RF high density plasma CVD devices, or the like may be employed. Additionally, variations of the above described system such as variations in susceptor design, heater design, RF power frequencies, location of RF power connections and others are possible. For example, the wafer could be supported and heated by a quartz lamps. The layer and method for forming such a layer of the present invention is not limited to any specific apparatus or to any specific plasma excitation method.

III. Depositing Stable Halogen-doped Silicon Oxide Films

The present invention provides a conformal halogen-doped layer having a low dielectric constant, good gap-fill properties and high stability. A preferred embodiment of the present invention, in which an FSG film is deposited from a process gas that includes $SiF_4$, TEOS, $O_2$ and a second source of fluorine is illustrated and described below for exemplary purposes. The present invention is not intended to be limited in any way to this preferred embodiment and is applicable to the formation of other FSG films from other process gases and to other halogen-doped silicon oxide films.

Figure 2:
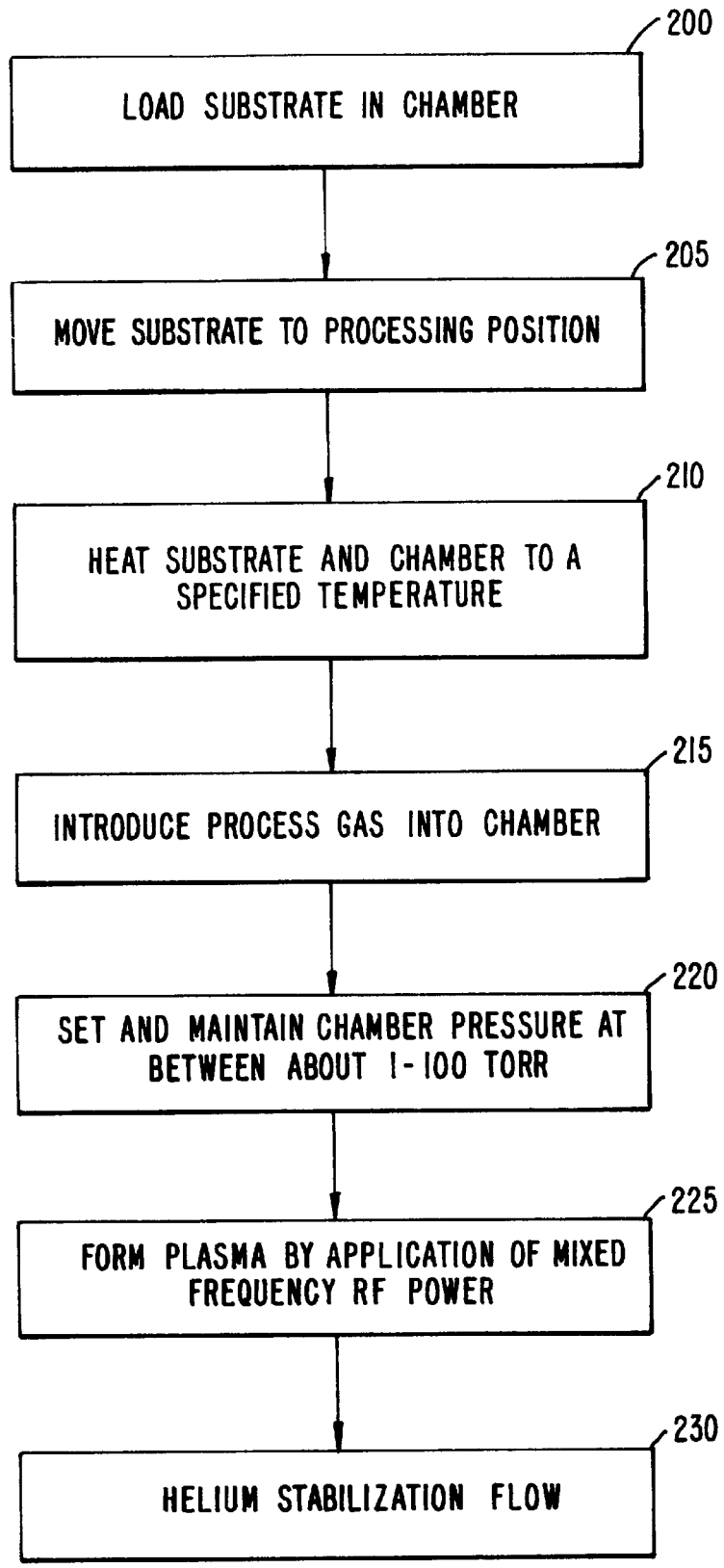
FIG. 2 is a flow chart illustrating process steps in the formation of a halogen-doped silicon oxide film according to an embodiment of the method of present invention.

To form an $SiF_4$-FSG film according to the preferred embodiment of the present invention, a wafer is loaded in vacuum chamber 15 through a vacuum-lock door and placed onto pedestal 12 (FIG. 2, step 200). The pedestal 12 is then moved into processing position 14 (step 205). In processing position 14, the substrate, typically a wafer is positioned between about 200 and 600 mil (preferably between about 220 and 300 mil) from gas distribution manifold 11.

Once the wafer is properly positioned, the wafer and pedestal 12 are heated to a temperature between 200° and 500° C. (step 210) and a process gas is introduced into the reaction chamber from the gas distribution manifold (step 215). Preferably, the wafer and susceptor are heated to a temperature between about 300° and 450° C. The process gas includes $SiF_4$ as a first fluorine source; TEOS; oxygen, in the form of $O_2$; helium and a second source of fluorine, such as $NF_3$ or $F_2$, that is relatively easy to break down into free fluorine. In some embodiments it is possible to use other fluorine sources (e.g., $CF_4$, $C_2F_6$, TEFS, FASI-4 or others) as the second source of fluorine. It is preferable, however, to employ a second fluorine source that does not include carbon or other elements that can contribute to film instability.

It is believed that the inclusion of the second fluorine source provides additional free fluorine in the plasma that enhances the etching effect of the growing film. The enhanced etching provides better gap-fill capabilities and improved stability. The ratio of the first fluorine source to the second fluorine source can be precisely controlled to maximize the gap-fill and stability characteristics of the film. For example, when $SiF_4$ is employed as the first fluorine source and $NF_3$ is employed as the second fluorine source, introducing too much $NF_3$ into the chamber can adversely effect film uniformity, stability and deposition rate. The rates at which each of the gases are introduced depends on the design and volume of the chamber among other factors and are discussed in more detail below.

A selected pressure of between about 1 and 100 torr in the reaction chamber (preferably between about 2 and 10 torr) is set and maintained throughout deposition by throttle valve 32 in conjunction with the vacuum pump system and the introduction of the process gas (step 220). After processing conditions are set, a plasma is formed (step 225) using a mixed-frequency RF power supply. The plasma is maintained for a selected time to deposit a layer having a desired thickness.

The power supply is driven at a high frequency between 13 and 14 MHz, preferably 13.56 MHz, at 50–2000 W (a power density of about 0.1 to 3.95 $W/cm^2$) and at a low frequency of less than about 500 KHz, preferably about 350 KHz, at 300 W or more. The low frequency power supply controls ion bombardment during deposition of the film. Increasing the power at which the low frequency supply is driven, increases ion bombardment and further stabilizes the growing film. Thus, it is preferable that the lower frequency power supply be driven at 400 W or more, and if appropriate for a particular hardware configuration, it is even more preferable that the low frequency power supply be driven at about 800 W or higher.

After deposition is complete, the introduction of silicon, oxygen and the halogen element is stopped and the plasma is extinguished. Helium flow is maintained for an additional 5–120 seconds or longer to further stabilize the film (step 230) as described in U.S. Ser. No. 08/616,707 entitled "METHOD AND APPARATUS FOR IMPROVING FILM STABILITY OF HALOGEN-DOPED SILICON OXIDE FILMS" and assigned to Applied Materials, Inc. The 08/616,707 application was filed on Mar. 15, 1996, and is hereby incorporated by reference for all purposes. Preferably, helium flow is maintained for at least an additional 10 seconds. During this period, chamber temperature and pressure remain unchanged. As described in the 08/616,707 application, it is believed that this helium-only flow step anneals the film, allowing some loosely bonded atoms to form stronger bonds and/or migrate from the deposited film. Once atoms outgas from the deposited film, the helium flow sweeps the outgassing atoms away so that they do not react or combine with other atoms at the film's surface to form additional loose bonds. It is possible to heat the chamber above the deposition temperature (e.g., up to 600° C.) during this helium anneal step to further stabilize the film. Preferably, however, the chamber temperature is maintained at about 450° C. or below so that deposited metal lines are not damaged.

In a current preferred embodiment of the present invention, gases are introduced at rates within the following ranges in step 215. TEOS, which is in liquid form at room temperature, is vaporized by a liquid injection valve or the like and combined with the helium carrier gas. TEOS is introduced into the liquid injection valve at a rate of about 500 to 3000 mgm (equivalent to a net flow rate of about 960 to 5760 sccm). $O_2$ is introduced into the chamber at a rate of about 200 to 2000 sccm. Helium is introduced at an elevated rate as described in the 08/616,707 application previously incorporated by reference. In one embodiment, the elevated helium introduction rate is provided by a 1600 sccm helium carrier gas flow for TEOS and a 1000 sccm helium flow introduced from a separate gas line.

The rate at which $SiF_4$ is introduced into the chamber depends on the desired fluorine concentration of the FSG film, but will generally be between about 100–4000 sccm for FSG films containing 0.5 to 5.7 percent $SiF_4$-FSG (as measured by Fourier transform infrared (FTIR) spectroscopy of the peak area ratio of SiF bonds to SiF+SiO bonds). The optimal ratio of $SiF_4$ to TEOS used to deposit an FSG film of a selected percent $SiF_4$-FSG depends on the power density of the plasma and other factors. When the high frequency RF power is 1350 W (a power density of 2.67 W/cm$^2$) the optimal $SiF_4$ to TEOS ratio is about 0.169:1 (650 sccm to 2000 mgm, which is equivalent to a net flow rate of about 3840 sccm) for a 1 % $SiF_4$-FSG film and 1.823:1 (3500 sccm to 1000 mgm, which is equivalent to a net flow rate of about 1920 sccm) for a 5.7% $SiF_4$-FSG film. At a higher power density, less $SiF_4$ is employed to deposit similar layers.

The second fluorine source ($NF_3$ or $F_2$) in this embodiment is introduced at a rate of 30–500 sccm. The combination of $SiF_4$ and second fluorine source in the process gas results in deposition of a stable film that has better gap-fill and other characteristics than an FSG film deposited from a single fluorine source such as just $SiF_4$, $NF_3$ or $F_2$.

It is believed that the use of $SiF_4$ provides extra silicon in the plasma thereby increasing the deposition rate of the film. $SiF_4$ also promotes the growth of a stable SiF network. $NF_3$ or $F_2$, on the other hand, are relatively easy to break down in the plasma, and provide an additional source of free fluorine to enhance the etching effect of the growing film thereby increasing its gap-fill capabilities. The ratio at which $NF_3$ or $F_2$ is introduced should be controlled so as to not provide too much free fluorine for the plasma. If too much $NF_3$ or $F_2$ is introduced into the chamber, too much free fluorine in the plasma may result in overetching of the growing film and may cause a decrease in deposition rate and uniformity problems. Accordingly, it is preferable that the ratio of either $NF_3$ or $F_2$ to $SiF_4$ be between about 0.0125:1 and 0.5:1.

Additionally, it is preferable that the ratio of the silicon source to oxygen source is increased over what would otherwise be the optimal ratio for deposition of a film using only a single halogen dopant. In one preferred embodiment, the ratio of TEOS to oxygen is between about 1.9:1 to 5.8:1. Even more preferably, the ratio is about 3.85:1 (e.g. 2000 mgm TEOS (equivalent to 3840 sccm) and 1000 sccm $O_2$) It is believed that the relatively low amount of oxygen available for reaction as compared to the amount of silicon reduces the formation of OH bonds in the growing film, which would otherwise lead to moisture absorption and film instability.

It is understood that the above gas introduction rates are based on a resistively heated DxZ DCVD chamber manufactured by Applied Materials that has a volume of 5.9 liters. The actual rates at which gases are introduced in other embodiments will vary if other chambers of different designs and/or volume are employed.

In one embodiment, all the constituents of the process gas are initially introduced simultaneously into the chamber. As an alternative to such a simultaneous introduction of constituent gases in step 215, preferred embodiments of the present invention employ a strict sequence in which the constituents are introduced. In these embodiments, helium or another gas is first introduced into the deposition chamber and a plasma is formed from the helium before TEOS and the fluorine sources are introduced. TEOS, $SiF_4$ and the second fluorine source are then introduced after the plasma has reached full power as described in U.S. Ser. No. 08/599,270, entitled "METHOD AND APPARATUS FOR IMPROVING THE FILM QUALITY OF PLASMA ENHANCED CVD FILMS AT THE INTERFACE", filed on Feb. 9, 1996, and having Anand Gupta, Virendra V. S. Rana, Amrita Verma, Mohan K. Bhan and Sudhakar Subrahmanyam listed as inventors. The 08/599,270 application is assigned to Applied Materials, applicants for the present invention, and is hereby incorporated by reference for all purposes. Such a process sequence minimizes incomplete reactions that may occur between the reactant gases while the plasma is initiated and thus further improves the quality and stability of the film.

IV. Test Results and Measurements

To show the effectiveness of the present invention, experiments were performed depositing various FSG films with and without the benefits of the method of the present invention. The experiments were performed in a resistively-heated DxZ chamber manufactured by Applied Materials. The DxZ chamber was outfitted for 200–mm wafers and situated in a P5000 substrate processing system also manufactured by Applied Materials.

Three different FSG films were deposited over low resistivity silicon wafers in the experiments. The deposition of each film included introducing $SiF_4$ into the chamber at a rate of 2100 sccm, 02 at 1000 sccm, TEOS at 2000 mgm combined with a helium carrier gas introduced at 1600 sccm, and a second source of helium introduced into the chamber at 1000 sccm. No $NF_3$ was added to the process gas for the first film (substrate 1). For the second and third films (substrates 2 and 3), $NF_3$ was added at 50 sccm and 100 sccm, respectively. The uniformity, stress, refractive index and dielectric constant were measured for each film and the results of the measurements are depicted below in Table 1.

TABLE 1

FSG FILM CHARACTERIZATION

| Substrate | SiF$_4$ (sccm) | NF$_3$ (sccm) | Dep. Rate | Unif. (%) | Ref. Index | Stress (1e9) | % F (FTIR) | Diec. Cons. |
|---|---|---|---|---|---|---|---|---|
| 1 | 2100 | 0 | 15630 | 1.2 | 1.418 | −0.70 | 2.45 | 3.42 |
| 2 | 2100 | 50 | 15300 | 2.0 | 1.4123 | −0.55 | 2.65 | 3.38 |
| 3 | 2100 | 100 | 15200 | 4.0 | 1.4094 | −0.48 | 2.75 | 3.36 |

Figure 3A:
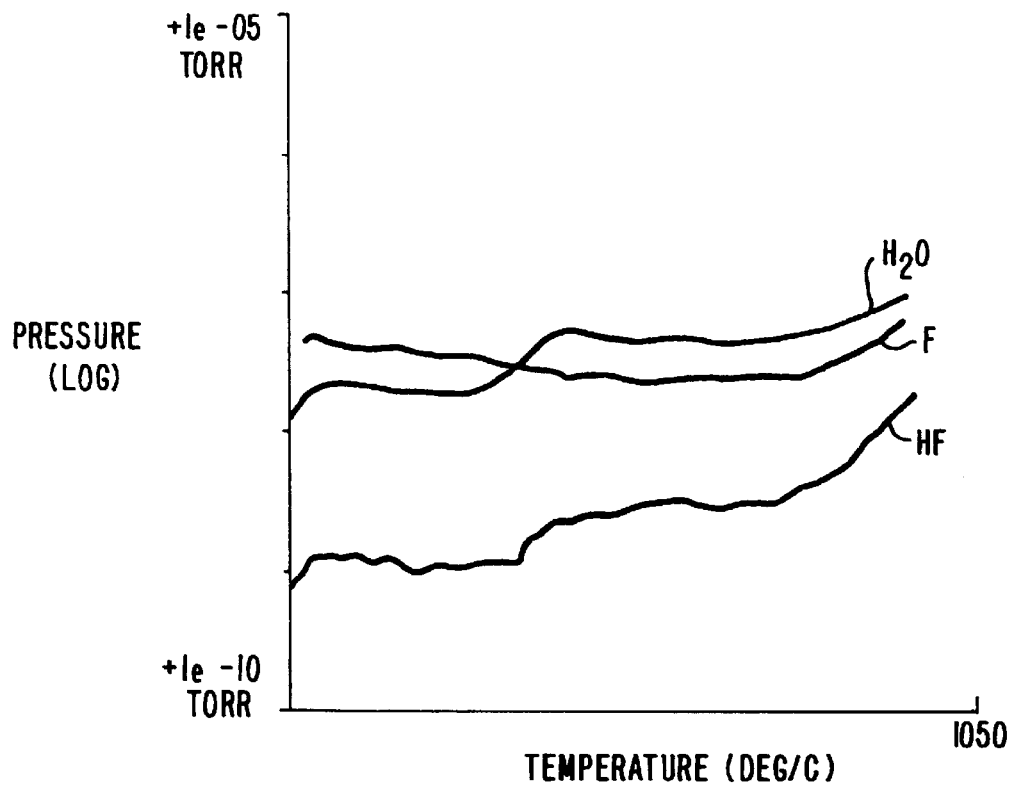
FIGS. 3A and 3B are thermal desorbtion spectra graphs comparing the outgassing of $H_2O$, HF and F in films deposited with and without the benefits of the present invention.
Figure 3B:
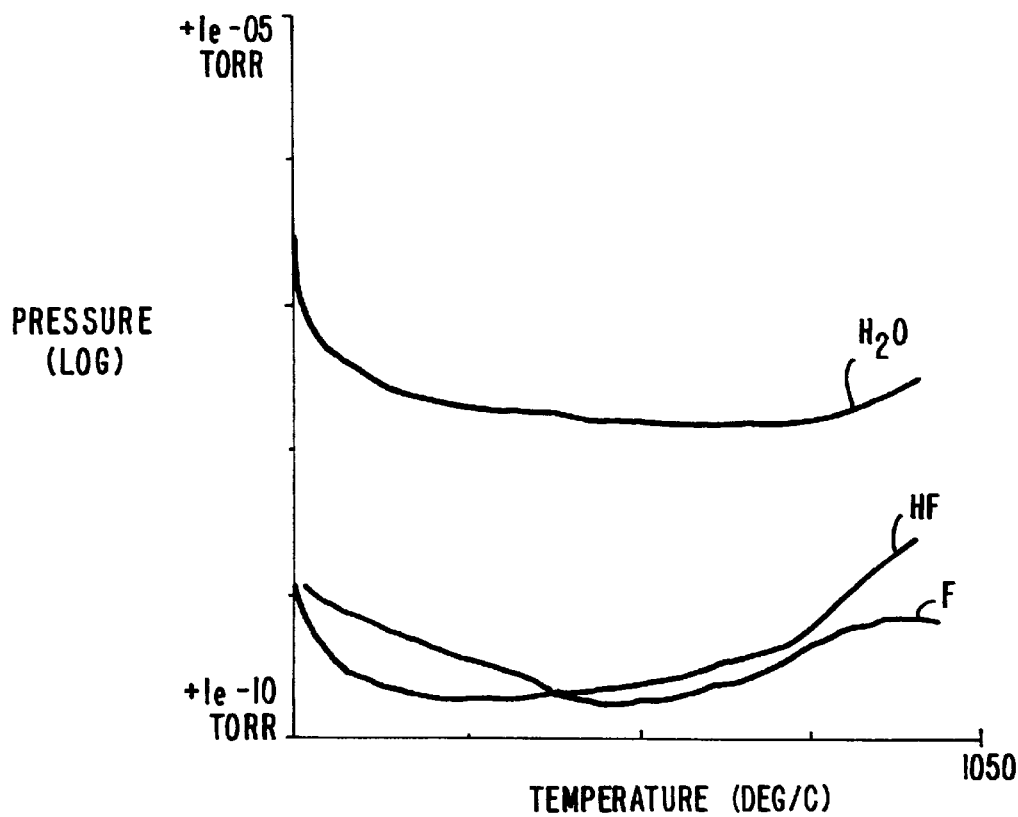

As evident from Table 1, the introduction of a relatively small amount of NF$_3$ into the process gas increased the amount of fluorine incorporated into the film thereby decreasing the film's dielectric constant. Also, thermal desorbtion spectra (TDS) data shows that a film deposited from a process gas including a relatively small amount of NF$_3$ is more stable than a film deposited without the addition of NF$_3$. FIG. 3A is a graph showing TDS data measuring the outgassing of H$_2$O, F and HF from the film deposited over the first substrate without the benefit of the present invention, and FIG. 3B is a graph of similar TDS data for the FSG film deposited over the second substrate where 50 sccm of NF$_3$ was introduced into the process gas. In FIG. 3A, it is evident that some H$_2$O and HF outgassing occurs at about 400°–450° C. As evident in FIG. 3B, on the other hand, substantially no HF or H$_2$O outgassing occurs until at least about 600° C.

V. Exemplary Structure

Figure 4:
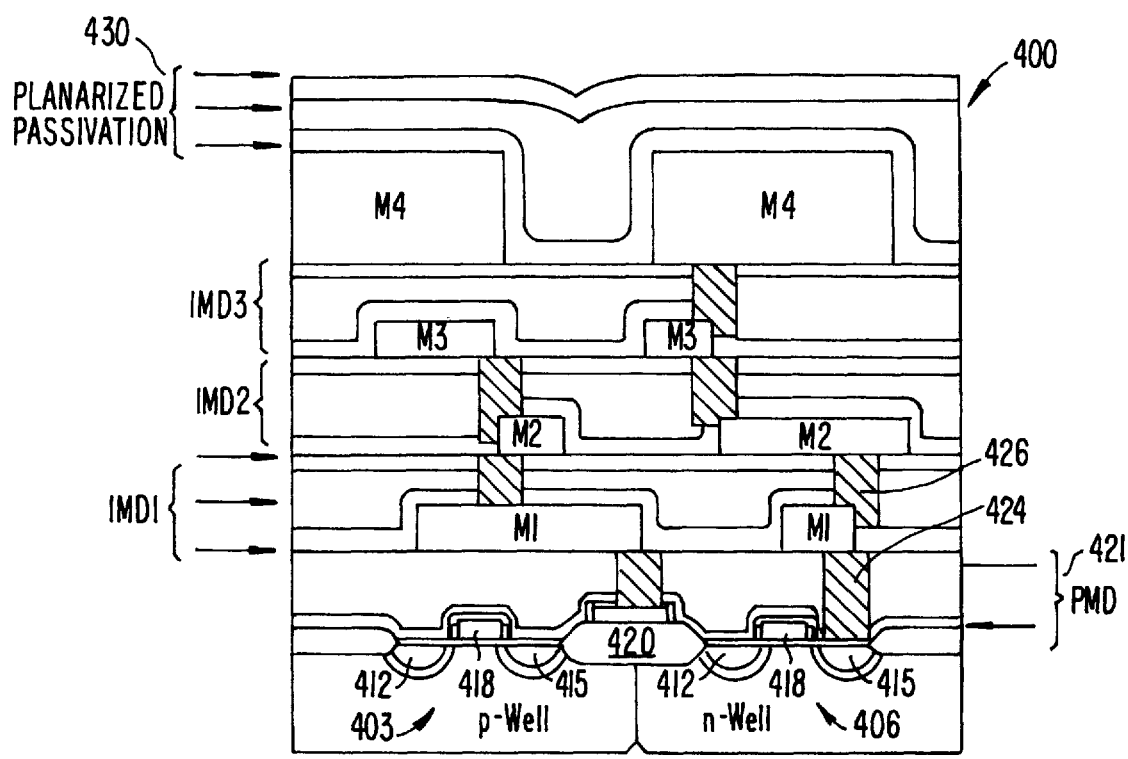
FIG. 4 is a simplified cross-sectional view of a semiconductor device manufactured according to the method of the present invention.

FIG. 4 illustrates a simplified cross-sectional view of a CMOS integrated circuit 400 according to the present invention. As shown, integrated circuit 400 includes NMOS and PMOS transistors 403 and 406, which are separated and electrically isolated from each other by a field oxide region 420. Each transistor 403 and 406 comprises a source region 412, a drain region 415 and a gate region 418.

A premetal dielectric layer 421 separates transistors 403 and 406 from metal layer M1 with connections between metal layer M1 and the transistors made by contacts 424. Metal layer M1 is one of four metal layers, M1–M4, included in integrated circuit 400. Each metal layer M1–M4 is separated from adjacent metal layers by respective intermetal dielectric layers IMD1, IMD2 or IMD3. Adjacent metal layers are connected at selected openings by vias 426. Deposited over metal layer M4 are planarized passivation layers 430.

Although the dielectric layer of the present invention may find uses in each of the dielectric layers shown in integrated circuit 400, physical properties of the film, such as its low dielectric constant and good gap-fill properties, along with the PECVD process used in formation of the preferred embodiments, make it most useful as an insulation layer between adjacent metal layers as shown by layers IMD1–IMD3. Typically, such IMD layers are between 0.2 and 3.0 μm thick.

The dielectric layer of the present invention may also be used in damascene layers that are included in some integrated circuits. In damascene layers, a blanket FSG layer is deposited over a substrate, selectively etched through to the substrate, and then filled with metal and etched back or polished to form metal contacts such as M1. After the metal layer is deposited, a second blanket FSG deposition is performed and selectively etched. The etched areas are then filled with metal and etched back or polished to form vias 426.

It should be understood that simplified integrated circuit 400 is for illustrative purposes only. One of ordinary skill in the art could implement the present method for fabrication of other integrated circuits such as microprocessors, application specific integrated circuits (ASICS), memory devices, and the like. Additionally, the method of the present invention may be used in the fabrication of integrated circuits using technologies such as BiCMOS, NMOS, bipolar and others.

Having fully described several embodiments of the present invention, many other equivalent or alternative methods of depositing the low dielectric constant oxide layer according to the present invention will be apparent to those skilled in the art. For example, although illustrated embodiments concerned a process using TEOS as a source of silicon and O$_2$ as a source of oxygen, it is possible to use other silicon sources such as silane, and other oxygen sources such as N$_2$O, CO or others. Also, fluorine sources other than SiF$_4$ as the main fluorine source (e.g., C$_2$F$_6$ or TEFS) may be used. These alternatives and equivalents are intended to be included within the scope of the present invention.

What is claimed is:

1. A process for depositing a halogen-doped silicon oxide layer on a substrate in a reactor chamber, said process comprising the steps of:

introducing, into said chamber, a process gas including a silicon-halide source, a halogen source different from said silicon-halide source, a silicon source and an oxygen source, said process gas having a greater quantity of said silicon-halide source than said halogen source wherein a ratio of said halogen source and said silicon halide source in is between about 0.0125 and 0.5:1, inclusive; and forming a plasma from said process gas to deposit said halogen-doped layer over said substrate.

2. The process of claim 1 wherein said halogen-doped silicon oxide layer is a fluorosilicate glass (FSG) layer, with said silicon-halide source including a first fluorine source.

3. The process of claim 2 wherein said halogen source includes a second fluorine source.

4. The process of claim 3 wherein said first fluorine source comprises SiF$_4$ and said silicon source comprises vaporized tetraethyloxysilane (TEOS).

5. The process of claim 4 wherein said second fluorine source is either NF$_3$ or F$_2$.

6. The process of claim 5 wherein an inert gas is also introduced into said chamber.

7. The process of claim 3 further comprising the step of setting and maintaining pressure between about 1 and 5 torr during deposition of said FSG layer.

8. The method of claim 1 wherein said silicon-halide source includes SiF$_4$ and said halogen is selected from the group consisting of NF$_3$ and F$_2$.

9. A process for depositing a halogen-doped silicon oxide layer on a substrate in a reactor chamber, said process comprising the steps of:

introducing, into said chamber, a process gas including a silicon-halide source, a halogen source different from said silicon-halide source, an oxygen source and TEOS, said process gas having a greater quantity of said silicon-halide source than said halogen source, with a ratio of TEOS to oxygen being between 1.92:1 and 5.76:1; and forming a plasma from said process gas to deposit said halogen-doped layer over said substrate.

10. The process of claim 9 wherein said halogen-doped silicon oxide layer is a fluorosilicate glass (FSG) layer, with said silicon-halide source including a first fluorine source.

11. The process of claim 10 wherein said first fluorine source is $SiF_4$.

12. The process of claim 10 wherein said halogen source includes a second fluorine source.

13. The process of claim 12 wherein said second fluorine source is either $NF_3$ or $F_2$.

14. The process of claim 9 wherein an inert gas is also introduced into said chamber.

15. The process of claim 11 wherein the ratio of said second fluorine source to said first fluorine source is between about 0.0125:1 and 0.5:1.

16. The process of claim 10 further comprising the step of setting and maintaining pressure between about 1 and 5 torr during deposition of said FSG layer.

17. The method of claim 9 further including a step of inserting an inert gas into said chamber, with said inert gas, said silicon-halide source, said halogen source, said silicon source and said oxygen source being disposed in said chamber before said forming step.

18. The method of claim 9 further including a step of inserting an inert gas into said process chamber, wherein said forming step occurs before said introducing step and after said inserting step.

19. The method of claim 9 wherein said silicon-halide source is introduced in said process chamber at a first rate and said halogen source is introduced into said process chamber at a second rate, with said first rate being in the range of 100–4000 sccm and said second rate being in the range of 30–500 sccm.

20. The process of claim 19 wherein said silicon-halide source is $SiF_4$.

21. The process of claim 20 wherein said second fluorine source is either $NF_3$ or $F_2$.

22. A method of depositing a fluorosilicate glass (FSG) layer over a substrate deposited in a substrate processing chamber, said method comprising the steps of:

introducing $SiF_4$, oxygen, TEOS, and either $NF_3$ or $F_2$ into said chamber, with $SiF_4$ being introduced at a first rate and either $NF_3$ or $F_2$ being introduced at a second rate so as to provide in said chamber, at any given instance in time, a greater quantity of $SiF_4$ than either $NF_3$ or $F_2$ so that a ratio of either $NF_3$ or $F_2$ to $SiF_4$, at given instance in time, is between about 0.0125 and 0.5:1;

heating an upper surface of said substrate to a temperature between about 200° and 500° C.;

setting and maintaining a pressure between about 2 and 10 torr within said chamber; and forming a plasma within said chamber to deposit said FSG layer over said substrate.

23. The method of claim 22 wherein said first rate is in the range of 100–4000 sccm and said second rate is in the range of 30–500 sccm.

24. The method of claim 22 further including a step of inserting an inert gas into said chamber, with said inert gas, $SiF_4$, oxygen, TEOS, and either $NF_3$ or $F_2$ being introduced into said chamber before said forming step.

25. The method of claim 24 wherein said forming step occurs before said introducing step and subsequent to said inserting step.

26. A process for depositing a halogen-doped silicon oxide layer on a substrate in a reactor chamber, said process comprising the steps of:

inserting, into said chamber, an inert gas;

introducing, into said chamber, a process gas including $SiF_4$, a silicon source, an oxygen source, and a halogen source selected from the group consisting of $NF_3$ and $F_2$, said $SiF_4$ being introduced into said chamber at a first rate and said halogen source being introduced into said chamber at a second rate; and forming a plasma from said inert gas to deposit said halogen-doped layer over said substrate, with said first and second rates established to provide a ratio of said halogen source to said $SiF_4$ of less than 0.5:1 so as to prevent excessive etching of said halogen-doped silicon oxide layer.

27. The method of claim 26 wherein both said introducing step and inserting step occur before said forming step.

28. The method of claim 26 wherein said forming step occurs before said introducing step and after said inserting step.

29. The method of claim 26 wherein said first rate is in the range of 100–4000 sccm and said second rate is in the range of 30–500 sccm.

* * * * *